(12) United States Patent
Lanceros Mendez et al.

(10) Patent No.: US 8,314,722 B2
(45) Date of Patent: Nov. 20, 2012

(54) KEYBOARD BASED IN POLYMER, COPOLYMER OR COMPOSITES WITH PIEZO- AND/OR PYROELECTRIC PROPERTIES AND RESPECTIVE USE

(75) Inventors: Senentxu Lanceros Mendez, Braga (PT); José Gerardo Vieira Rocha, Guimaraes (PT); Vitor Joao Gomes Da Silva Sencadas, Braga (PT)

(73) Assignee: Universidade Do Minho, Braga (PT)

( * ) Notice: Subject to any disclaimer, the term of this patent is extended or adjusted under 35 U.S.C. 154(b) by 340 days.

(21) Appl. No.: 12/669,602

(22) PCT Filed: Jul. 17, 2008

(86) PCT No.: PCT/PT2008/000028
§ 371 (c)(1), (2), (4) Date: Jun. 18, 2010

(87) PCT Pub. No.: WO2009/011605
PCT Pub. Date: Jan. 22, 2009

(65) Prior Publication Data
US 2010/0253552 A1   Oct. 7, 2010

(30) Foreign Application Priority Data
Jul. 17, 2007   (PT) .......................... 103791

(51) Int. Cl.
*H03M 11/00* (2006.01)
*H03K 17/94* (2006.01)
(52) U.S. Cl. .......................... 341/22; 310/339
(58) Field of Classification Search ............ 341/22, 341/143, 34; 310/339; 701/33.6
See application file for complete search history.

(56) References Cited

U.S. PATENT DOCUMENTS
3,935,485 A   1/1976   Yoshida et al.
(Continued)

FOREIGN PATENT DOCUMENTS
JP   2103823   8/1988
(Continued)

OTHER PUBLICATIONS
Piezo Film Sensors Technical Manual, "Piezo Film Sensors Technical Manual passage", Measurement Specialties, US, No. 1005663-1 Rev. B, pp. 1-89, Apr. 2, 1999.
(Continued)

*Primary Examiner* — Peguy JeanPierre
(74) *Attorney, Agent, or Firm* — Pearl Cohen Zedek Latzer, LLP

(57) ABSTRACT

The invention refers to a new keyboard based in a polymeric, copolymeric or composite film (11) with piezo- and pyroelectric properties capable of receiving a tactile signal and giving a respond in the form of an electrical signal. The system described in this invention includes one or more keys (10), being each one of them made by a piezoelectric film (11) with electric conductive contacts, transparent or not, above and below the piezoelectric film and with the inferior layer of grounded electrodes (13). The present invention allows the use of just one piezoelectric film (11) without external power supply, the use of electrode connections which form the keys (10) that converge in one side of the keyboard and are available in the spots (12) to make the connection to the active filter circuits instead of amplifiers in the electronic readout, as well as the possibility of introduction of new functionalities in these keyboards identical to the ones of tactile sensors, upon distinction between a pyroelectric and a piezoelectric signal from a particular key, differing the signals generated by pressure variation or by temperature variation.

13 Claims, 2 Drawing Sheets

U.S. PATENT DOCUMENTS

| | | | |
|---|---|---|---|
| 4,078,187 A | 3/1978 | Kanisawa et al. | |
| 4,234,813 A | 11/1980 | Iguchi et al. | |
| 4,328,441 A | 5/1982 | Kroeger, Jr. et al. | |
| 4,516,112 A | 5/1985 | Chen | |
| 4,633,123 A | 12/1986 | Radice | |
| 4,901,074 A * | 2/1990 | Sinn et al. | 341/22 |
| 4,975,616 A * | 12/1990 | Park | 310/339 |
| 5,315,204 A | 5/1994 | Park | |
| 7,421,321 B2 * | 9/2008 | Breed et al. | 701/33.6 |
| 2011/0043328 A1 * | 2/2011 | Bassali | 340/5.71 |

FOREIGN PATENT DOCUMENTS

| | | |
|---|---|---|
| WO | WO 81/02223 | 8/1981 |

OTHER PUBLICATIONS

International Search Report, PCT/PT2008/000028, Date of Mailing: Jan. 7, 2009.

\* cited by examiner

KEYBOARD BASED IN POLYMER, COPOLYMER OR COMPOSITES WITH PIEZO- AND/OR PYROELECTRIC PROPERTIES AND RESPECTIVE USE

CROSS-REFERENCE TO RELATED APPLICATIONS

This application is a National Phase Application of PCT International Application No. PCT/PT2008/000028, International Filing Date Jul. 17, 2008, entitled "Keyboard Based in Polymer, Copolymer or Composite with Piezo- and/or Pyroelectric Properties and Respective Use", published on Jan. 22, 2009 as International Publication Number WO 2009/011605 which claims priority of PT 103791 Patent Application filed on Jul. 17, 2007, both of which are incorporated herein by reference in their entirety.

TECHNICAL FIELD OF THE INVENTION

The present invention belongs to the laminar keyboards domain, based on piezoelectric polymers which can have several applications, such as laptop computers or personal computers, pocket calculator, remote controls, mobile phones, music players (mp3, cd's, etc.), automated teller machine (ATM), electrical goods in general, sell machines (ex. Tobacco, drinks and food), elevators, ticket machines, laboratory equipments, electric and mechanical measurement equipments, tactile screens, interactive panels, etc.

BACKGROUND OF THE INVENTION

Generically, a keyboard is a device made by a set of switches or keys, which generates an electrical signal when a mechanical pressure is applied in one of the keys. From this generic definition, a keyboard is any device based on pressure switches that can be placed in computers (desktop/laptop), pocket calculator, remote controls, mobile phones, music players (mp3, cd's, etc.), automated teller machine (ATM), electrical goods in general, sell machines (ex. Tobacco, drinks and food), elevators, ticket machines, laboratory equipments, electric and mechanical measurement equipments, tactile screens, interactive panels, etc.

A keyboard is a device composed by a set of sensors that when a mechanical pressure is applied in each one of them an electrical signal of binary type is generated, i.e., each sensor distinguishes only if there was a pressure applied or not on itself.

The keyboards are the devices more used as men-machine interaction systems. For most of the applications it is necessary to have keyboards which are light weight, of high reliability, insensible to electromagnetic interferences and with low production costs. Depending on the application, it can be necessary to follow aesthetic criteria, such as color, transparency, or presence or absence of moving parts and key sound.

When classified relatively to mechanical arrangement, there are basically two types of keyboards: the conventional ones based on pressure buttons and the laminar ones. In the conventional keyboards based on pressure buttons, each key is constituted basically by one button, one spring and one electrical contact. When a pressure is applied on the button, the electrical contact is shorted and the pressure is detected. The spring is used to put the button back in its initial position. This type of keyboard covers most of the computer keyboards. The laminar keyboards, also known as flexible membrane switches, normally presents a laminar construction with two sheets, being the electrical contacts constructed in each of them. The contacts are oppositely mounted one against the other in the two sheets, being separated normally by air. When a pressure is applied in a button, the upper sheet deforms itself and makes contact with the correspondent area of the lower sheet.

The conventional or the laminar keyboards with metallic contacts become less reliable after a long period of use. For instance, the electrical contact resistance when a key is pressed, ideally should be very low, but it tends to increase with time, due to accumulated dust, oxide formation in the contacts or to accidental spill of liquids over the keyboard. The increase of the resistance has as a consequence the incorrect readout from some keys. Besides that, in the laminar keyboards with metallic contacts, the membrane is deformed with each pressure in a key, leading to fatigue or even to rupture.

To eliminate these disadvantages from the keyboards using metallic contacts, some applications make use of Hall effect switches or capacitive keys. These types of switches present the disadvantages of needing a more complex geometry and electronic interface than the previous ones.

Another type of laminar keyboards uses piezoelectric materials. In this case, an applied pressure in the piezoelectric material produces a voltage variation in their terminals, which can be used to determine if there was pressure or not. Between the piezoelectric devices that can be used in keyboards manufacture, the crystals and the ceramics are the most used. These materials, besides giving good electrical signals, are rigid, break easily, are difficult to build in complex shapes and create electrical voltages which can be high when subjected to sound waves.

Recently laminar keyboards have been developed based on piezoelectric polymers. These resolve substantially the problems of the switches based on metallic contacts. They are also more advantageous in relation to the keyboards that use piezoelectric crystals or ceramics, since they are easier to process, more flexible and have a good mechanical response, being in this way the most suitable for this kind of applications.

Relatively to the readout circuits for the keys, the conventional keyboards based on pressure buttons and the laminar ones based on metallic contacts, usually just need coded circuits which output the correspondent binary code of the pressed key. Since each key conduct or interrupt the electric current, it is not necessary any kind of amplification circuit or voltage level adaptation. In keyboards based in piezoelectric polymers, normally the voltage or the current generated when a key is pressed is low. In this case and in case when it is necessary, there are some voltage or current amplification mechanism and or voltage level adaptation before the coded circuits. Usually these circuits are based in voltage or current amplifiers or voltage/current converters. Since the piezoelectric elements are sensible to sound waves, these circuits will amplify these same waves, giving wrong readouts from the keys. Despite the aforementioned facts, there are several applications, methods and geometries used as keyboards based in piezoelectric polymers.

The documents WO8102223, U.S. Pat. No. 4,328,441 and U.S. Pat. No. 4,633,123 use two films of piezoelectric polymers separated by an insulator material. In each of the piezoelectric films are impressed the metallic conductive contacts that forms the keys. The fact of possessing two piezoelectric films allows that the line and column of the local where the mechanic pressure is applied can be readout in an independent way: in this way the upper film reads only the line and the lower film reads only the column. In these applications are also described several readout electronic circuits from the keys.

The document U.S. Pat. No. 4,234,813 describes a keyboard based in piezoelectric polymers and uses their piezoelectric and pyroelectric proprieties to receive the stimulus. Like in the previous applications, two films of piezoelectric polymers are used: one to decode the lines and the other to decode the columns.

The documents U.S. Pat. No. 4,078,187 and U.S. Pat. No. 3,935,485 describe the use of a complex mechanic arrangement based in piezoelectric elements.

The document JP2103823 describes the use of several electrodes (two or three) of different dimensions and geometries for each key. Since the electrodes of different dimensions generate electrical signals of different amplitudes, it is possible to know what is the key pressed by means of the voltage generated in each contact. These electrodes are connected to the readout circuit by two or three conductive wires which connect one electrode of each key in parallel with the correspondent neighbor key.

The document U.S. Pat. No. 4,516,112 describes a transparent keyboard system. In this application there is not a clarification of the materials used in the electrodes in order to make them transparent.

Some piezoelectric polymeric materials respond also to the pyroelectric effect which produces a voltage proportional to temperature variation, as is mentioned in the document U.S. Pat. No. 4,975,616.

GENERAL DESCRIPTION OF THE INVENTION

The proposed keyboard in the present invention is based on a polymeric material, copolymer or composite which have piezo- and pyroelectric proprieties being the electronic processing part of the signal connected to the set of keys drawn in the faces of the piezoelectric polymer.

The polymeric material, polyvinylidene fluoride or PVDF, can be obtained in the form of a film by extrusion, injection or evaporation from the solution, usually in the form of non electroactive ($\alpha$ phase).

The $\alpha$ phase is usually obtained by cooling from the melt at moderate or even at high cooling velocities. It is the most stable thermodynamic phase also in crystallization from the solution, when the temperature of solvent removal is higher to 100° C.

To obtain the electroactive phase ($\beta$ phase), the $\alpha$ phase should be submitted to a mechanical stretching at temperatures lower than 100° C. and with a stretch rate (relation between the final and the initial length of the sample) higher or equal to 2. This phase can also be obtained by solution, at temperatures of solvent removal lower than 70° C.

After obtaining the electroactive phase, the material is subjected to a polarization process, i.e., a high electric field is applied in order to maximize the pyro- and piezoelectric response of the polymer.

Once this step is completed, the electrical contacts are deposited by physical or chemical evaporation, cathodic pulverization, or other material deposition process. In the conventional mode, a vacuum chamber is used where the piezoelectric polymer is placed. Underneath and closer to this one a mask is placed with the design of the keys, contacts and their connections. Finally, under the mask, at a distance of a few centimeters a sample holder is placed with the material inside that is going to form the contacts. The holder is then heated by an electric current until the material that is going to form the contacts evaporates. The vapor passes through the holes of the mask and is deposited in the piezoelectric polymer, forming thus the contacts of the keys.

These electrodes will give place to the keys (10) of the new keyboard and can be produced from metallic oxides, like Al:ZnO or the Sn:In$_2$O$_3$, or conductive polymers like the Poly(3,4-ethylenedioxythiophene): poly(styrenesulfonate) (PEDOT:PSS) or the polyanilline. In the case the keys do not need to be transparent for a determined application, the electrodes could be made from any metal such as Al, Ag, etc.

Figure 1:
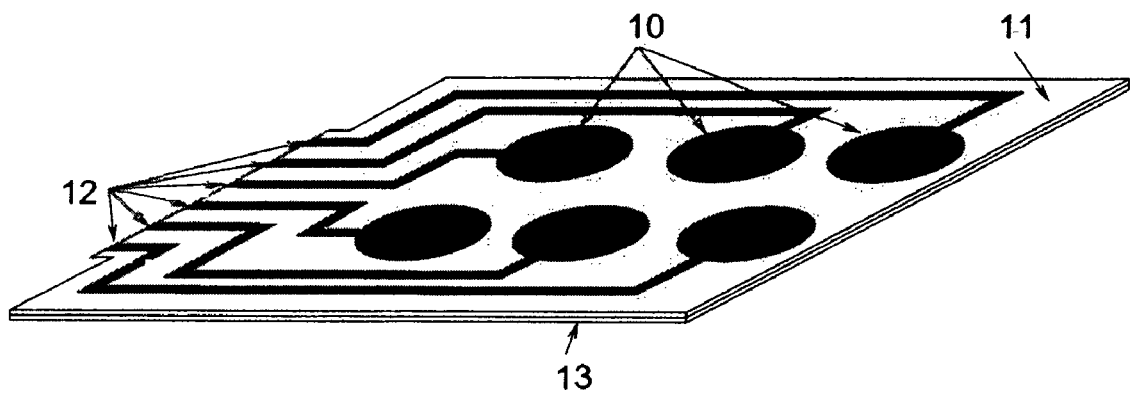
FIG. 1 shows the keyboard arrangement, where it can be seen the electrodes which form the keys (10) when placed upon the piezoelectric film (11). Under the piezoelectric film (11) the grounded electrode is placed (13). The electrode connections which form the keys (10) converge in one side of the keyboard and are available to make the connection to the readout circuit in the spot (12). The electrodes are made from conductive materials which could be or not transparent.
Figure 2:
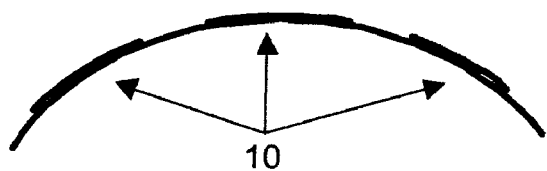
FIG. 2 illustrate the keyboard flexibility where it can be observed the upper electrodes that form the keys (10) when placed upon the piezoelectric film (11).
Figure 3:
FIG. 3 represent a block diagram of the readout system of a single key, consisting in the key itself (10), one band-pass filter (20), a full-wave rectifier (30) and a low-pass filter (40), being the signal obtained at the output (50).

In the case that the keyboard is composed by a few keys, circuit illustrated in FIG. 3 can be repeated for each one of them. In this circuit, the electrical signal produced by the pressed key will be applied to a band-pass filter (20).

The main objective of this filter is based on the fact that is necessary to separate the piezoelectric and pyroelectric effect if it is desired to introduce new functionalities into the keyboards.

Both effects are always present when the material is pyroelectric, and depending on the application it can be interesting use one or other. With this method, it is enough to tune the central frequency of the band-pass filter to a few hundred Hertz, in the case that the desired effect is the piezoelectric, or a few Hertz in the case the desired effect is the pyroelectric.

The band-pass filter (20) has yet the function of attenuating the noise significantly, which can be induced in the keyboard by electromagnetic waves, by sound waves, by thermal effects or other forms.

The output signal obtained from the band-pass filter (20) has approximately a sinusoidal wave form. In most types of applications, where the keyboard is connected to a digital circuit, it is necessary to eliminate the negative component of this signal. For that, the rectifier is used (30).

This rectifier can be half-wave, cutting only the negative component of the signal, or full wave where the negative component is inverted.

After pressing a key, at the output of the rectifier (30) several pulses are obtained, and it is necessary to pass the signal by a low-pass filter (40), in order to smooth the response and obtain just one pulse at the output (50) for each applied pressure in the key (10).

The function of the low-pass filter can however be obtained digitally with a rebound eliminating circuit identical to the one used in the keyboards based on metallic contacts.

Figure 4:
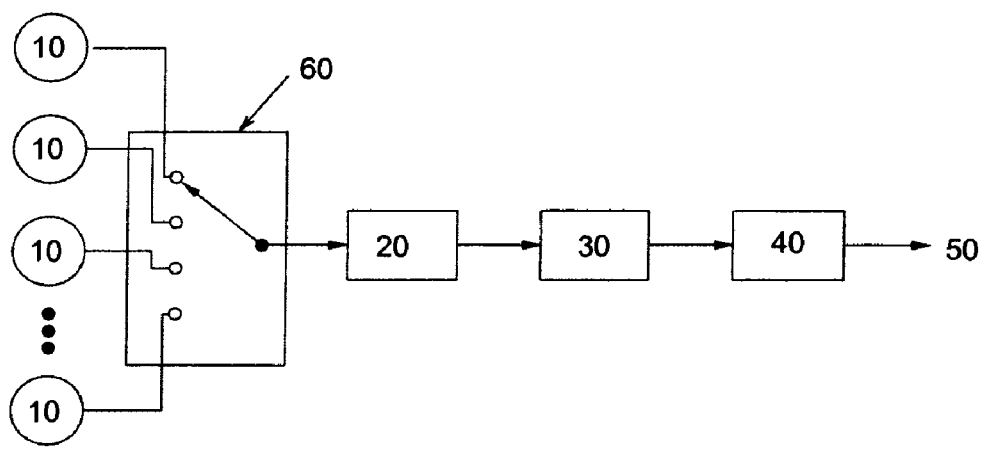
FIG. 4 represent a block diagram of the readout system of several keys, consisting in the keys itself (10), one multiplexer (60), one band-pass filter (20), a full-wave rectifier (30) and a low-pass filter (40), being the signal obtained at the output (50).

In the case of the present invention where it is necessary to read several keys with only one readout circuit, the one illustrated on FIG. 4 is used, where a multiplexer (60) is introduced which scan all the keys (10), one at a time. In this case, the multiplexer (60) establishes the electric connection between the key and the band-pass filter (20). In the case of having pressure in one of the keys, its signal is applied to the band-pass filter (20) and the rest of the circuit works at the same mode as represented in FIG. 3. In this circuit as the multiplexer (60) scans all the keys (10) in a relative fast way, the time constant of the low-pass filter (40), if it is high, can compromise the performance of the circuit. In this case the alternative of using a digital circuit of rebound elimination is more advantageous. This digital circuit of rebound elimination can be based on a monostable multivibrator where the time constant is adjusted so that the several impulses or rebounds that are generated when a key is pressed can be grouped in one single output impulse.

A preferential accomplishment of the present invention incorporate the construction of a computer keyboard, mobile phone, TV remote control or other with the characteristics of using a single piezoelectric film, flexible or not, with transparent electrodes or not, without needing any external power supply for the functioning of the keys.

Another preferential accomplishment incorporates the characteristics of the transparent electrodes, that can be placed in lines and columns in the piezoelectric polymer, or in determined places on the polymer, with other geometries, allowing the construction of a tactile screen or interactive panel with the advantage of using one single piezoelectric film, flexible or not, with transparent electrodes and not needing an external power supply for the functioning of the keys. This allows interactive panels, from small to high dimension with one single or several active areas and with the possibility of multi-touch functionality.

The system of the present invention allows the use of a single piezoelectric film without any external power supply using the electric energy generated by the pressure applied on the piezoelectric polymer, the use of transparent metallic contacts and the use of active filters instead of amplifiers, in the readout electronic.

The possibility of distinguish a piezoelectric and a pyroelectric signal of one specific key allows the introduction of new functionalities in the keyboards similar to, tactile sensors, differing generated signals by pressure effect and by temperature variation.

The main differences between the present invention and the previous ones are the possibility of using only one piezoelectric film, the possibility of using transparent metallic contacts or non-metallic and the use of active filters instead of amplifiers in the readout electronics, that exists in the present invention.

The documents U.S. Pat. No. 4,078,187 and U.S. Pat. No. 3,935,485 describe the use of a complex mechanic arrangement based in piezoelectric elements. In this case the structure of the keyboard is not laminar and the piezoelectric elements are not polymeric, as it happens in the present invention.

The document JP2103823 describes the use of several electrodes (two or three) of different dimensions and geometries for each key. Since the electrodes of different dimensions generate electrical signals of different amplitudes, it is possible to know what is the key pressed by means of the voltage generated in each contact. These electrodes are connected to the readout circuit by two or three conductive wires which connect one electrode of each key in parallel with the correspondent neighbor key. The main difference between this type of keyboard and the one reported in the present invention, is based on the fact that the present invention does not uses electrodes with complex geometries, which varies from key to key.

The document U.S. Pat. No. 4,516,112 describes a transparent keyboard system. In this application there is not a clarification of the materials used in the electrodes in order to make them transparent. There is not also an elucidation about any electronic circuit which allows the readout from the keys, contrary to what happens in the present invention.

Some piezoelectric polymeric materials respond also to the pyroelectric effect which produces a voltage proportional to temperature variation, as is mentioned in the document U.S. Pat. No. 4,975,616. Contrary to the present invention, it is not possible to distinguish, in terms of amplitude, the voltages generated by the piezoelectric and pyroelectric effects. In this sense, it is not possible to know if a key was pressed or if it was due to a temperature variation.

The main advantages of this keyboard, relatively to the ones existed in the market, are fundamentally in the processing facility, reliability, durability, their flexibility and the fact of having good mechanical and chemical resistance. Others advantages are the possibility of using only one piezoelectric film, the possibility of using transparent metallic contacts or non metallic and the use of active filters instead of amplifiers in the readout electronics, as explained in the present invention.

DETAILED DESCRIPTION ON THE INVENTION

The present invention consists in a keyboard which is based in a polymeric material, the polyvinylidene fluoride or PVDF, copolymeric and/or composite, with piezo- and pyroelectric proprieties, in form of films.

The electrical contacts are deposited in the film of polymeric material by physical or chemical evaporation, cathodic pulverization, or other material deposition process and gives place to the keys of the keyboard of the present invention. Underneath the polymeric film is placed the grounded electrode (13). The connections to the electrodes that forms the keys (10) converges in one side of the keyboard and are available to make the connection to the circuit on the spots (12).

The electrodes are build from conductive materials which can be or not transparent and can or not need external power supply to operate the keys.

These electrodes can be made from metallic oxides, like Al:ZnO or Sn:In$_2$O$_3$, conductive polymers like the Poly(3,4-ethylenedioxythiophene): poly(styrenesulfonate) (PEDOT:PSS) or the polyanilline, or metals such as Al, Au, etc.

In case the system is constituted by a small number of keys it should include, besides the key(s) (10), electrodes, a band-pass filter (20), a complete wave rectifier (30) and a low-pass filter (40).

In the case the system is constituted by a high number of keys it should include, besides this, a multiplexer (60), a band-pass filter (20), a rectifier (30), a low-pass filter (40), or preferentially, a digital circuit.

The system can also include transparent electrodes placed in lines or columns in the polymeric film configuring one or more touch screens or interactive panels.

It must be clear that the keyboard based in polymer, copolymer or composite with piezo- and/or pyroelectric proprieties described previously is simply a possible example of implementation, only established to a clear understand of the invention principles. It can be done variations and modifications to the concretization referred previously without substantial deviation from the spirit and principle of the invention. All the modifications and variations should be included in the scope of the present invention and protected by the following claims.

The invention claimed is:

1. Laminar keyboard based on a material with piezo- and/or pyroelectric proprieties, comprising:
   a film consisting of a polymeric, copolymeric or composite material with piezo- and/or pyroelectric proprieties;
   at least one key formed by one conductive electrode and by the film with piezo- and/or pyroelectric proprieties, which thus induces a mechanical and/or thermal signal;
   a grounded electrode placed underneath the piezoelectric film;
   connections between the keys and the readout system of the keys by means of the contact points;
   a band-pass filter that separates the piezoelectric and the pyroelectric effects through the regulation of its central frequency; a multiplexer which establishes the electric connection between each contact point and the bandpass filter
   a rectifier which eliminates the negative component from the output signal on the band-pass filter; and
   a low-pass filter, that filters the signal from the rectifier or a digital circuit of rebound elimination from the signal provided by the rectifier in order to obtain a single pulse at the output for the pressure applied in each key.

2. Laminar keyboard, according to claim 1, wherein the polymeric material is the polyvinylidene fluoride or PVDF.

3. Laminar keyboard, according to claim 1, wherein in that it does not need external power supply due to the piezoelectric effect.

4. Laminar keyboard, according to claim 1, wherein the film of polymeric material is transparent.

5. Laminar keyboard, according to claim 1, wherein the film of polymeric material is flexible.

6. Laminar keyboard, according to claim 1, wherein the band-pass filter and/or the low-pass filter are active or passive.

7. Laminar keyboard, according to claim 1, wherein the conductive electrodes are deposited in the polymeric film by steam deposition physical or chemical techniques, by cathodic pulverization or thermal evaporation.

8. Laminar keyboard, according to claim 1, wherein the conductive electrodes of the keys are transparent.

9. Laminar keyboard, according to claim 1, wherein the transparent electrodes are placed in lines and columns in the piezoelectric film, or in certain places of the piezoelectric film with other geometries, configuring touch screens or interactive panels with small or big dimensions, with a single or several active areas and with multi-touch functionalities.

10. Laminar keyboard, according to claim 1, wherein the digital circuit of rebound elimination consists of a monostable multivibrator with a time constant adjusted so that the various impulses or rebounds generated when a key is pressed can be grouped in a single impulse output.

11. Use of the laminar keyboard based on a piezo- and pyroelectric polymer, according to claim 1, wherein it is useful for command applications of several electronic devices.

12. Use of the laminar keyboard based on a piezo- and pyroelectric polymer, according to claim 1, wherein the electronic devices are car radios, interactive panels, keyboards in general, remote controls, touch screens with multi-touch functionalities.

13. Laminar keyboard based on a material with piezo- and/or pyroelectric proprieties, comprising:
   a film constituted by a polymeric, copolymeric or composite material with piezo- and/or pyroelectric proprieties;
   at least one key formed by one conductive electrode and by the film with piezo- and/or pyroelectric proprieties, which thus induces a mechanical and/or thermal signal;
   a grounded electrode placed underneath the piezoelectric film;
   connections between the keys and a band-pass filter;
   at least a band-pass filter that separates the piezoelectric and the pyroelectric effects by means of the regulation of its central frequency;
   a rectifier which eliminates the negative component from the output signal on the band-pass filter; and
   a low-pass filter, that filters the signal from the rectifier or a digital circuit of rebound elimination from the signal provided by the rectifier in order to obtain a single pulse at the output for the pressure applied in each key.

* * * * *